United States Patent [19]

Rodi et al.

[11] Patent Number: 4,642,455
[45] Date of Patent: Feb. 10, 1987

[54] CIRCUIT ARRANGEMENT USING FOR A LIGHT BARRIER FOR DETECTING SHEET-FEEDING FAULTS IN A PRINTING PRESS

[75] Inventors: Anto Rodi; Udo Blasius, both of Leimen, Fed. Rep. of Germany

[73] Assignee: Heidelberger Druckmaschinen AG, Heidelberg, Fed. Rep. of Germany

[21] Appl. No.: 581,281

[22] Filed: Feb. 17, 1984

[30] Foreign Application Priority Data

Feb. 18, 1983 [DE] Fed. Rep. of Germany ....... 3305606

[51] Int. Cl.$^4$ .............................................. G01V 9/04
[52] U.S. Cl. ..................................... 250/221; 340/556
[58] Field of Search ................... 250/221, 222.1, 223, 250/224, 548, 557, 561, 571; 340/555, 556, 557, 567, 573

[56] References Cited

U.S. PATENT DOCUMENTS 3,258,594 6/1966 Pfeifer ................................ 250/561
4,149,089 4/1979 Idelsohn et al. ..................... 250/563

Primary Examiner—David C. Nelms
Assistant Examiner—Stephen Allen
Attorney, Agent, or Firm—Herbert L. Lerner; Laurence A. Greenberg

[57] ABSTRACT

A circuit arrangement for a light barrier for detecting absence or presence of an opaque object at a given location, includes an apparatus for transmitting a signal in response to the disposition of the object, an apparatus for receiving the signal, an apparatus for evaluating the received signal, and an apparatus for initiating a follow-up operation in response to the evaluation of the received signal. The transmitting and receiving apparatus is formed as a reflex light barrier, a digital filter is connected between the transmitting and receiving apparatus and the evaluating apparatus includes two parallel-connected bistable flip-flop circuits, wherein one of the flip-flop circuits has an inverted clock input.

5 Claims, 3 Drawing Figures

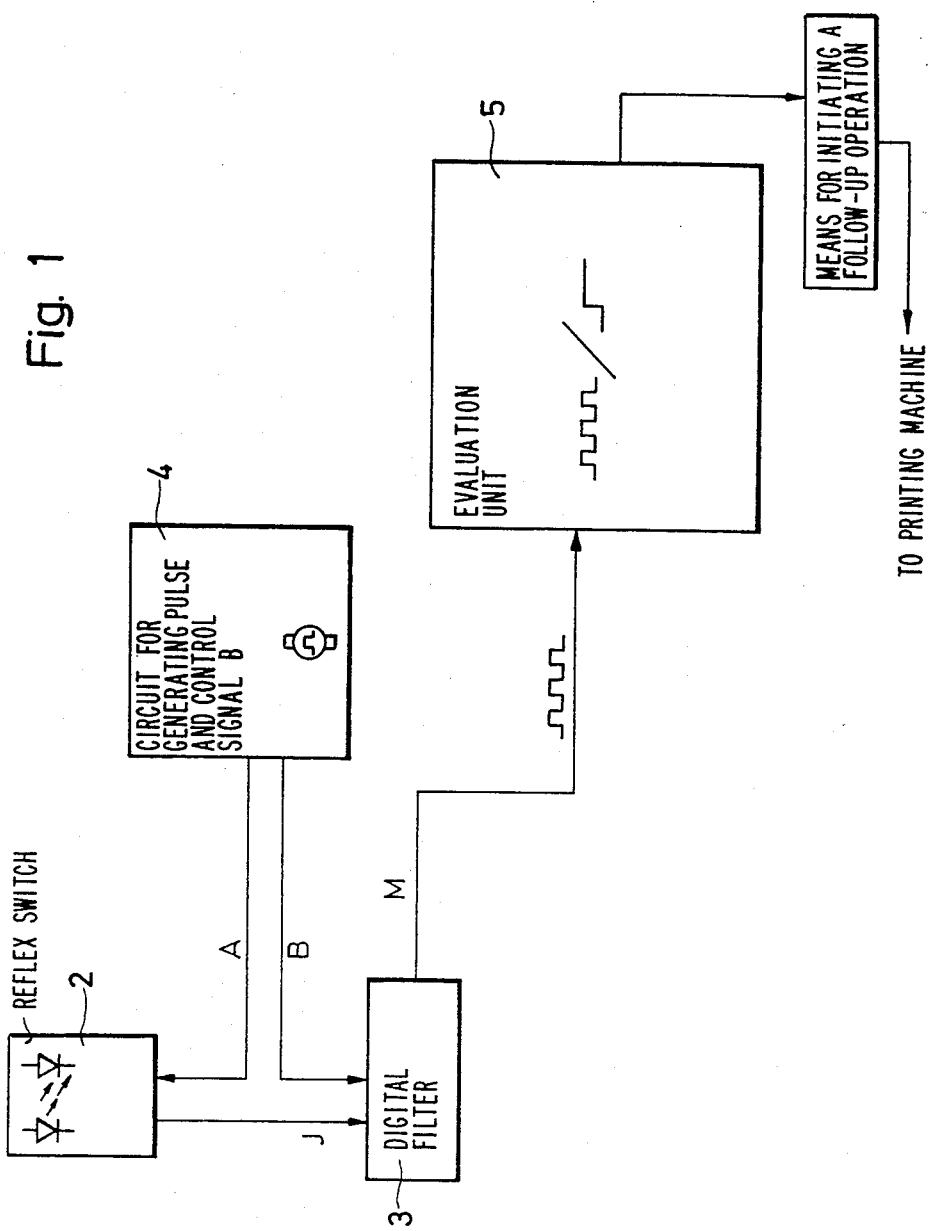

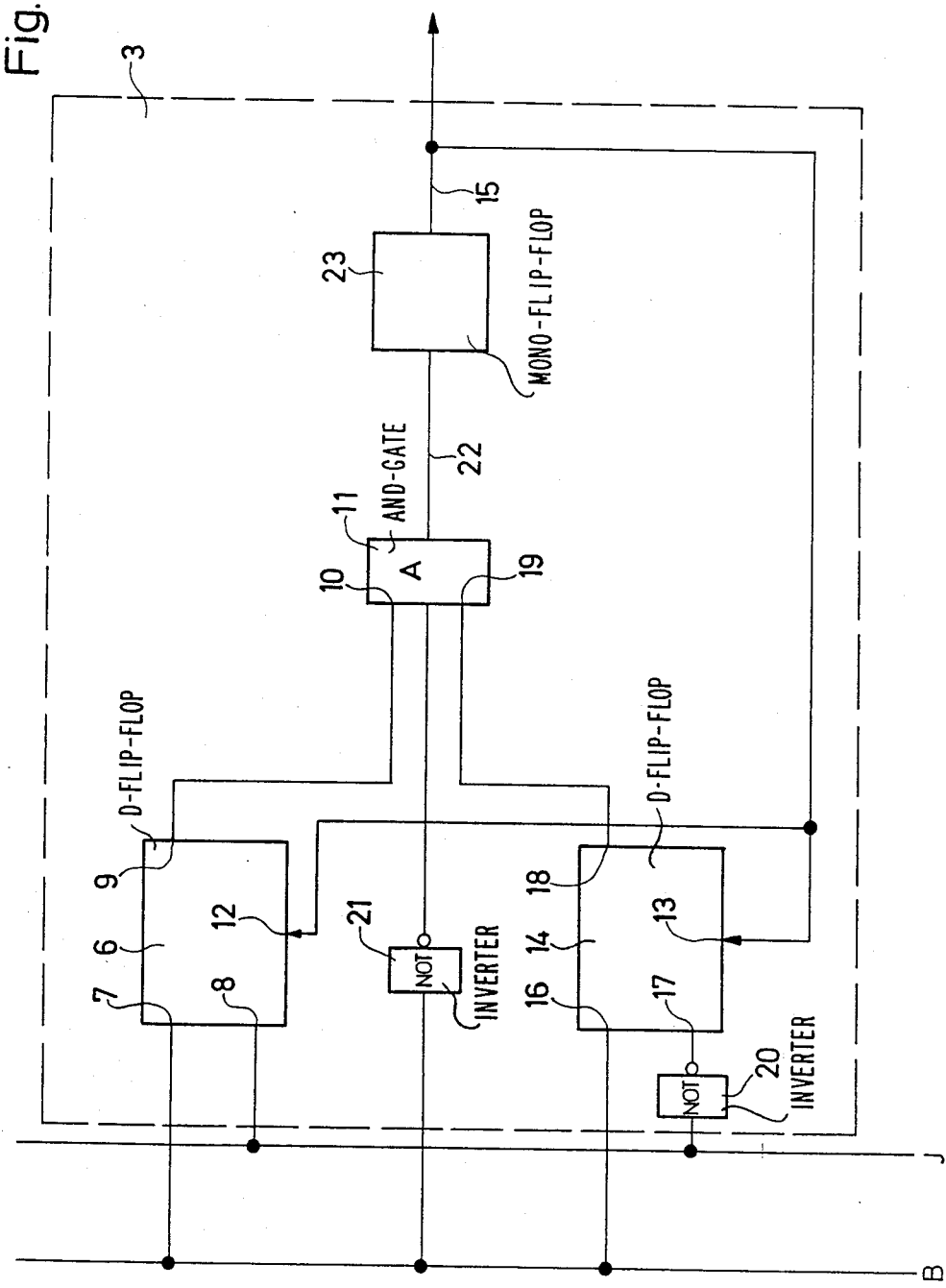

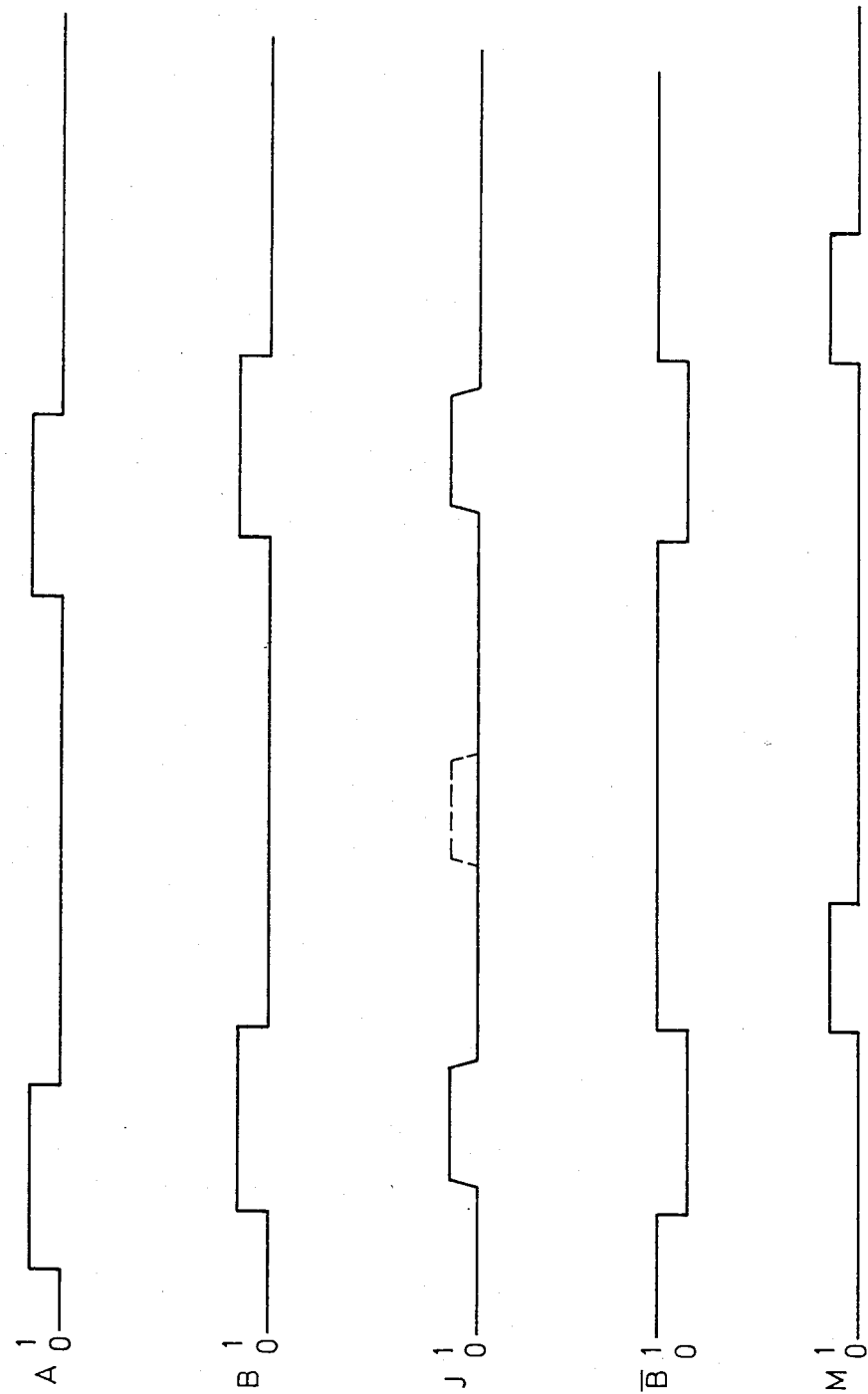

CIRCUIT ARRANGEMENT USING FOR A LIGHT BARRIER FOR DETECTING SHEET-FEEDING FAULTS IN A PRINTING PRESS

BACKGROUND OF THE INVENTION

1. Field of the Invention

The invention relates to a circuit arrangement for light barriers.

An optoelectronic or "seeing-eye" sheet monitoring device, wherein signals from missing sheets, skewed sheets, early arriving sheets and/or multiple sheets in printing presses are detected by transmitting and receiving means and are processed by evaluation means and fed to the printing press for the initiation of follow-up operations, which are examples of the application of such light barriers.

2. Description of the Prior Art

Analog evaluation means for signals have become known heretofore. German Published Non-Prosecuted Application (DE-OS) No. 29 01 229 A1 describes a capacitive monitoring and evaluation means in printing presses for monitoring missing and/or multiple sheets.

SUMMARY OF THE INVENTION

A comparison circuit connected to a pulse generator is followed by a comparator circuit, a phase evaluation circuit and an evaluation circuit for missing and multiple sheets.

The comparison circuit is formed of an RC element or network with a measuring capacitor and a further RC element with a comparator capacitor. The pulse generator for generating the pulse voltage is connected to the RC elements via a potentiometer for setting to indicate missing and/or multiple sheets. The comparator circuit is formed of an operational amplifier, and AND gates are used for phase evaluation. An amplifier is used for the evaluation circuit. The monitoring of missing and/or multiple sheets is performed by means of variations in capacitance of the measuring capacitor of the comparison circuit. By means of signal processing, the variations in capacitance are detected and fed to the printing press for the initiation of follow-up operations. This is realized by comparing the signal delay times of a pulse voltage via an integrator element with the measuring capacitor and via a comparison RC element or network.

A disadvantage of these heretofore-known capacitive measuring and monitoring means is that the degree of accuracy is still not adequate for detecting of all missing and/or multiple sheets in printing presses. In addition, superimposed signals cause incorrect measurements and lead to malfunctions in the printing process. Furthermore, this measuring and monitoring method proves disadvantageous due to the very long integration times which are presently required.

It is accordingly an object of the invention to provide a circuit arrangement for light barriers wherein signals supplied, for example, from reflex light barriers, are freed from superimposed interference in order to obtain very rapidly only the true, i.e. the desired, information and to transmit it to the following electronics, thereby reducing down times and wastage of printing presses.

With the foregoing and other objects in view there is provided, in accordance with the invention, a circuit arrangement for a light barrier for detecting absence or presence of an opaque object at a given location, comprising means for transmitting a signal in response to the disposition of the object, means for receiving the signal, means for evaluating the received signal, and means for initiating a follow-up; operation in response to the evaluation of the received signal, the transmitting and receiving means being formed as a reflex light barrier, a digital filter being connected between the transmitting and receiving means and the evaluating means and including two parallel-connected bistable flip-flop circuits, one of the flip-flop circuits having an inverted clock input.

In accordance with a more specific feature of the invention, the light barrier is in an optoelectronic sheet monitoring device for a sheet-fed printing press, with the opaque object being a sheet traveling through the printing press, wherein at least one of the absence, skewing, early arrival and multiple presence of the sheet at the given location is being detectable by the light barrier.

In accordance with another feature of the invention, the two flip-flop circuits of the digital filter have respective outputs, and include at least one AND gate following both of the outputs of the flip-flop circuits.

In accordance with a further feature of the invention, the following AND gate of the digital filter has at least one time-pulsed input and an input followed by a timer.

In accordance with a concomitant feature of the invention, the two bistable flip-flop circuits have respective reset inputs, and the timer has an output connected to the evaluating means and to the reset inputs.

The evaluation electronics thus permit a considerably faster signal evaluation than conventional signal evaluation means. The device according to the invention filters out fault signals caused by malfunctions i.e. only the important and necessary information is filtered out, thereby ensuring undisturbed performance of the printing process.

Other features which are considered as characteristic for the invention are set forth in the appended claims.

Although the invention is illustrated and described herein as embodied in a circuit arrangement for a light barrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 1 is a block diagram of an optical monitoring device having a digital filter;

FIG. 2 is a circuit diagram of the digital filter of FIG. 1; and

FIG. 3 is a pulse diagram of input and output signals of the digital filter.

DESCRIPTION OF THE PREFERRED EMBODIMENT

Referring now to the drawing and, first, particularly to FIG. 1 thereof, there is shown an optical monitoring device formed of a conventional reflex switch 2, available e.g. from the firm Visolux Ltd., 28 Clifton Industrial Estate, Cambridge; a conventional, otherwise non-illustrated circuit 4 for generating a transmitting current pulse A for the reflex switch 2 and for generating a control signal B for a digital filter 3. The digital filter 3 is followed by a conventional evaluation unit 5 not otherwise shown in detail.

FIG. 2 is the circuit diagram of the digital filter 3. An output signal J of the reflex switch 2 is applied to a clock input 8 of a first D-flip-flop 6. The output signal J which has been inverted by an inverting element 20 is applied to a clock input 17 of a second D-flip-flop 14. A data input 7 of the D-flip-flop 6 and a data input 16 of a D-flip-flop 14 are connected to the output signal B which is generated in the circuit 4 for generating a transmitting current pulse A. Q-outputs 9 and 18 as well as the signal B, $\bar{B}$, which has been inverted by an inverting NOT element 21, are interconnected by an AND gate 11. An output signal 22 of the AND gate 11 triggers a following monoflop 23 which has an output pulse 15 applied to the evaluation unit 5 as well as to reset inputs 12 and 13 of the D-flip-flops 6 and 14, respectively.

FIG. 3 is a pulse diagram showing the sequence and the signal levels A, B, J, $\bar{B}$, M during operation. The operating principle of the digital filter 3 is described hereinafter. The transmitting current pulses A are applied at a given frequency for example 10 kHz, to the reflex switch 2. Depending upon whether the reflex switch 2 detects an object or not, it provides an output signal J of identical frequency and identical pulse width. However, the output signals J are deformed in relation to the transmitting current pulses A. The pulse start and the pulse end of the output signal J are shifted by a given amount in relation to the pulse start and the pulse end of the transmitting current pulse A. A pulse B is thus generated with a delay of at least this given amount in relation to the transmitting current pulse A.

When the reflex switch 2 emits an output signal J, the rising edge thereof at the clock input 8 of the flip-flop 6 causes the data B at the data input 7 of the D-flip-flop 6 to be transferred to the Q-output 9 and this data is stored. The falling edge of the output signal J at the clock input 17 of the D-flip-flop 14 causes the data B at the data input 16 of the D-flip-flop 14 to be transferred to the Q-output 18 thereof and this data is stored. Only the logic level "1" can, therefore, be at the Q-output 9 of the D-flip-flop 6 and at the Q-output 18 of the D-flip-flop 14 if, at the time of the rising edge and of the falling edge, respectively, of the output signal J, the logic signal level of the data B were likewise at "1". The output signals of the two Q-outputs 9 and 18 of the D-flip-flops 6 and 14, respectively, are additionally gated with the inverted signal B, $\bar{B}$ via the AND element 11. The output signal 22 of this AND element 11, therefore, has only the logic signal level "1" if the data B has a logic level "0" and the Q-outputs 9 and 18 of the D-flip-flop 6 and 14 have the logic signal level "1". The following monoflop 23 is triggered by the positive edge of the output signal 22. The output pulse 15 of the monoflop 23 is set to a time which is dependent upon the clock frequency of the transmitting current pulse A and upon the design of the following conventional evaluation circuit 5. The D-flip-flops 6 and 14 are also reset simultaneously by the output pulse 15 of the monoflop 23.

The digital filter 3 is thus designated as a fade-out or safety circuit for reflex light barriers and is used for obtaining a clean, interference-free signal.

The foregoing is a description corresponding in substance to German Application No. P 33 05 606.4, filed Feb. 18, 1983, the International priority of which is being claimed for the instant application, and which is hereby made part of this application. Any discrepancies between the foregoing specification and the aforementioned corresponding German application are to be resolved in favor of the latter.

We claim:

1. Circuit arrangement including a light barrier for detecting absence or presence of an opaque object at a given location, comprising means for transmitting a light signal in direction toward an anticipated position of the object, means for receiving said signal, means for evaluating said received signal after an anticipated time delay, and means for initiating a follow-up operation in response to the evaluation of said received signal, said transmitting and receiving means constituted by a reflex light barrier, a digital filter being connected between said transmitting and receiving means and said evaluating means and including first and second parallel-connected bistable flip-flop circuits, a delayed pulse train timingly enabling the inputs of the respective flip-flops at the anticipated time for receipt of the leading and trailing edge of said received signal, the second one of said flip-flop circuits having an inverted clock input, for repeatedly setting said flip-flops in response to repeated timingly confirming the proper position of the object.

2. Circuit arrangement according to claim 1 wherein said two flip-flop circuits of said digital filter have respective outputs, and including at least one AND gate following both of said outputs of said flip-flop circuits, and a monoflop having a time response depending upon said anticipated delay for signalling improper position of the object.

3. Circuit arrangement according to claim 2 wherein said following AND gate of said digital filter has at least one time-pulsed input and an output followed by a timer.

4. Circuit arrangement according to claim 3 wherein said two bistable flip-flop circuits have respective reset inputs, and said timer has an output connected to said evaluating means and to said reset inputs.

5. Circuit arrangement according to claim 1 wherein the light barrier is in an optoelectronic sheet monitoring device for a sheet-fed printing press, the opaque object being a sheet traveling through the printing press, at least one of the absence, skewing, early arrival and presence of multiple sheets at the given location being detectable by the light barrier.

* * * * *